(12) United States Patent
Nakamoto (10) Patent No.: US 10,971,766 B2
(45) Date of Patent: Apr. 6, 2021

(54) MANAGEMENT SYSTEM, BATTERY, AND MANAGEMENT METHOD FOR ENERGY STORAGE DEVICE

(71) Applicant: GS Yuasa International Ltd., Kyoto (JP)

(72) Inventor: Takeshi Nakamoto, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 0 days.

(21) Appl. No.: 16/758,709

(22) PCT Filed: Nov. 7, 2018

(86) PCT No.: PCT/JP2018/041269
§ 371 (c)(1),
(2) Date: Apr. 23, 2020

(87) PCT Pub. No.: WO2019/093349
PCT Pub. Date: May 16, 2019

(65) Prior Publication Data
US 2020/0341072 A1    Oct. 29, 2020

(30) Foreign Application Priority Data
Nov. 8, 2017   (JP) .............................. JP2017-215696

(51) Int. Cl.
*H01M 10/44*        (2006.01)
*G01R 31/3842*      (2019.01)
(Continued)

(52) U.S. Cl.
CPC .......... *H01M 10/44* (2013.01); *G01R 31/378* (2019.01); *G01R 31/3842* (2019.01);
(Continued)

(58) Field of Classification Search
CPC .............. G01R 31/3842; G01R 31/378; G01R 31/367; H01M 4/583; H01M 4/5825; H01M 10/44; H01M 10/48; H02J 7/0048
(Continued)

(56) References Cited

U.S. PATENT DOCUMENTS

| 2004/0008031 A1* | 1/2004 | Arai ...................... H01M 10/48 324/429 |
| 2009/0236564 A1 | 9/2009 | Yasunaga et al. |

(Continued)

FOREIGN PATENT DOCUMENTS

| JP | 5098146 B2 | 12/2012 |
| JP | 2013-105519 A | 5/2013 |

(Continued)

OTHER PUBLICATIONS

International Searching Authority, International Search Report and Written Opinion for International Application No. PCT/JP2018/041269, dated Dec. 18, 2018, (7 pages), Japanese Patent Office, Tokyo, Japan.

*Primary Examiner* — Edward Tso
*Assistant Examiner* — Aaron Piggush
(74) *Attorney, Agent, or Firm* — Alston & Bird LLP (57) ABSTRACT

Provided is a management device (BMS 40) for an assembled battery 30 which uses a positive electrode active material containing lithium iron phosphate and having an electrically conductive layer formed on a surface thereof, the BMS 40 being provided with: a current sensor 43 which measures a current flowing through the assembled battery 30; a voltage sensor 45 which measures a voltage of the assembled battery 30; and a management unit 42. When a state in which the current value measured by means of the current sensor 43 is less than a reference value is defined as a pause state of the assembled battery 30, the management unit 42, when the assembled battery 30 has entered the pause (Continued)

state, performs: a discharge process (S101) for causing the assembled battery 30 to discharge; a post-discharge measurement process (S102) for measuring the voltage by means of the voltage sensor 45 after the assembled battery 30 has been discharged in the discharge process; and a first estimation process (S103) of estimating the SOC of the assembled battery 30 on the basis of the voltage measured in the post-discharge measurement process and OCV-SOC characteristics 62 after the discharge.

9 Claims, 8 Drawing Sheets

(51) Int. Cl.
  *G01R 31/378* (2019.01)
  *H01M 4/58* (2010.01)
  *H01M 4/583* (2010.01)
  *H01M 10/48* (2006.01)
  *H02J 7/00* (2006.01)

(52) U.S. Cl.
  CPC ......... *H01M 4/583* (2013.01); *H01M 4/5825* (2013.01); *H01M 10/48* (2013.01); *H02J 7/0048* (2020.01)

(58) Field of Classification Search
  USPC .................. 320/132, 134, 136, 157, 162
  See application file for complete search history.

(56) References Cited

U.S. PATENT DOCUMENTS

| | | | |
|---|---|---|---|
| 2014/0320141 A1 | 10/2014 | Kaburagi et al. | |
| 2015/0028815 A1 | 1/2015 | Osawa et al. | |
| 2016/0259012 A1* | 9/2016 | Sejima et al. | G01R 31/367 324/426 |
| 2018/0203071 A1* | 7/2018 | Takemura et al. | G01R 31/367 324/433 |

FOREIGN PATENT DOCUMENTS

| | | |
|---|---|---|
| JP | 2013-213809 A | 10/2013 |
| JP | 2013-251221 A | 12/2013 |
| JP | 2014-059206 A | 4/2014 |
| JP | 2016-075572 A | 5/2016 |
| WO | WO-2017/010475 A1 | 1/2017 |

* cited by examiner

MANAGEMENT SYSTEM, BATTERY, AND MANAGEMENT METHOD FOR ENERGY STORAGE DEVICE

CROSS REFERENCE TO RELATED APPLICATIONS

This application is a national stage application, filed under 35 U.S.C. § 371, of International Application No. PCT/JP2018/041269, filed Nov. 7, 2018, which application claims priority to Japanese Application No. 2017-215696, filed Nov. 8, 2017, the contents of both of which as are hereby incorporated by reference in their entireties.

BACKGROUND

Technical Field

The technique disclosed in this specification relates to a technique for managing an energy storage device using a positive active material that contains lithium iron phosphate and has a conductive layer formed on a surface.

Description of Related Art

Conventionally, an energy storage device having a positive active material containing lithium iron phosphate is known. Since lithium iron phosphate has a high thermal stability, safety of the energy storage device can be remarkably improved, but there is a problem of low conductivity. To solve this problem, there is also known an energy storage device using a positive active material that contains lithium iron phosphate and has a conductive layer such as carbon formed on a surface (for example, see Patent No. JP-B2-5098146).

Conventionally, a charge state of an energy storage device has been estimated by measuring a voltage (open circuit voltage: OCV) of the energy storage device and specifying a charge state corresponding to the measured voltage, from a correlation between a voltage and a charge state. The charge state is represented by a ratio (%) of an amount of charged electricity to a charge capacity of the energy storage device, and is generally called a state of charge (SOC).

BRIEF SUMMARY

However, in an energy storage device using a positive active material that contains lithium iron phosphate and has a conductive layer such as carbon formed on a surface, in some cases, it is not possible to accurately estimate a charge state by simply specifying a charge state corresponding to a voltage of the energy storage device from a correlation between a voltage and a charge state.

This specification discloses a technique capable of accurately estimating a charge state of an energy storage device using a positive active material that contains lithium iron phosphate and has a conductive layer formed on a surface.

A management system according to one aspect of the present invention includes: a current measurement unit that measures a current flowing through an energy storage device using a positive active material that contains lithium iron phosphate, a conductive layer being formed on a surface of the positive active material; a voltage measurement unit that measures a voltage of the energy storage device; and a management unit. When a state in which a current value measured by the current measurement unit is less than a reference value is defined as a pause state of the energy storage device, the management unit executes: a discharge process of discharging the energy storage device when the energy storage device is brought into the pause state; a post-discharge measurement process of measuring a voltage with the voltage measurement unit after discharge of the energy storage device in the discharge process; and a first estimation process of estimating a charge state of the energy storage device based on the voltage measured in the post-discharge measurement process and based on a correlation between a charge state and a voltage in a pause state after discharge.

According to an aspect of the present invention, it is possible to accurately estimate a charge state of an energy storage device using a positive active material that contains lithium iron phosphate and has a conductive layer formed on a surface.

DETAILED DESCRIPTION OF VARIOUS EMBODIMENTS

[Overview of Present Embodiment]

A management system for an energy storage device using a positive active material that contains lithium iron phosphate, a conductive layer being formed on a surface of the positive active material, includes: a current measurement unit that measures a current flowing through the energy storage device; a voltage measurement unit that measures a voltage of the energy storage device; and a management unit. When a state in which a current value measured by the current measurement unit is less than a reference value is defined as a pause state of the energy storage device, the management unit executes: a discharge process of discharging the energy storage device when the energy storage device is brought into the pause state; a post-discharge measurement process of measuring a voltage with the voltage measurement unit after discharge of the energy storage device in the discharge process; and a first estimation process of estimating a charge state of the energy storage device based on the voltage measured in the post-discharge measurement process and based on a correlation between a charge state and a voltage in a pause state after discharge.

The inventor of the present application has found that, in an energy storage device using a positive active material that contains lithium iron phosphate, a conductive layer being formed on a surface of the positive active material, a correlation between a voltage and a charge state is different between a case where the energy storage device is brought into a pause state after charge (when a current equal to or higher than a reference value flows in a charge direction), and a case where the energy storage device is brought into a pause state after discharge (when a current equal to or higher than a reference value flows in a discharge direction). In the following description, the fact that a correlation is different between a case of being brought into the pause state after charge and a case of being brought into the pause state after discharge is referred to as hysteresis characteristics. The reason that the energy storage device using the positive active material that contains lithium iron phosphate and has the conductive layer formed on the surface has the hysteresis characteristics is because lithium iron phosphate has low conductivity, and thus the charge state differs between the conductive layer formed on the surface and the lithium iron phosphate inside.

As a method for estimating a charge state of such an energy storage device, a method is considered in which, for example, estimation is made from a correlation between a charge state and a voltage in a pause state after charge in a case of the pause state after charge, and estimation is made from a correlation between a charge state and a voltage in a pause state after discharge in a case of the pause state after discharge. Alternatively, a method is considered in which an average of these correlations is regarded as the correlation and estimation is made based on the correlation. However, in some cases, these methods cannot accurately estimate the charge state.

Specifically, a correlation between a charge state and a voltage in a pause state after charge has a smaller change amount in the voltage with respect to a change in the charge state than that of a correlation between a charge state and a voltage in a pause state after discharge. Therefore, in a case of being brought into a pause state after charge, when a charge state is estimated from a correlation between a charge state and a voltage in a pause state after charge, estimation accuracy is deteriorated as compared with a case of being brought into a pause state after discharge. In addition, when an average of these correlations is regarded as the correlation, the estimation accuracy is deteriorated as well.

On the other hand, in a case of being brought into a pause state after charge, when the energy storage device is discharged and a charge state is estimated based on a correlation between a charge state and a voltage in a pause state after discharge, the charge state of the energy storage device can be more accurately estimated than a case of estimating based on a correlation between a charge state and a voltage in a pause state after charge and a case of estimating from an average of the correlations.

However, there are also cases where it is not possible to know whether the energy storage device has been charged or discharged immediately before the pause state. According to the management system described above, when the energy storage device is brought into a pause state, the energy storage device is discharged regardless of whether the energy storage device has been charged or discharged immediately before the pause state. Therefore, the charge state can be accurately estimated even if it is not possible to know whether the energy storage device has been charged or discharged immediately before the pause state.

Therefore, according to the management system described above, it is possible to accurately estimate a charge state of the energy storage device using the positive active material that contains lithium iron phosphate and has the conductive layer formed on the surface.

The management system described above may include a storage unit that stores post-discharge correlation information indicating a correlation between a charge state and a voltage in a pause state after discharge. The management unit may estimate, in the first estimation process, a charge state of the energy storage device by specifying a charge state corresponding to a voltage measured in the post-discharge measurement process from the post-discharge correlation information.

According to the management system described above, when the energy storage device changes to a pause state after charge, the energy storage device is discharged and then a charge state is estimated from a correlation between a charge state and a voltage in a pause state after discharge. Therefore, the charge state can be more accurately estimated than a case of estimating from a correlation between a charge state and a voltage in a pause state after charge.

A negative active material of the energy storage device may contain graphite. The management system described above may include a storage unit that stores voltage difference information indicating a correlation between a charge state and a voltage difference between a voltage in a pause state after charge and a voltage in a pause state after discharge. A change in the voltage difference with respect to a change in the charge state may have an inflection point. The management unit may execute a pre-discharge measurement process of measuring a voltage with the voltage measurement unit before discharge of the energy storage device in the discharge process when the energy storage device is brought into a pause state after charge, and the management unit may estimate a charge state of the energy storage device by specifying a charge state corresponding to a voltage difference from the voltage difference information when, in the first estimation process, the voltage difference between a voltage measured in the pre-discharge measurement process and a voltage measured in the post-discharge measurement process is smaller than a minimum voltage difference in a range where a charge state is smaller than a charge state at the inflection point.

In the energy storage device having the negative active material containing graphite, when a correlation between a voltage and a charge state is graphed, there are a minute change region (plateau region) where a change amount in the voltage with respect to a change in the charge state is relatively small, and a steep change region (non-plateau region) where the change amount is relatively large.

The inventor of the present application has found that, in an energy storage device in which the positive active material contains lithium iron phosphate, the negative active material contains graphite, and a conductive layer such as carbon is formed on a surface of the positive active material, an inflection point appears when a correlation between a charge state and a voltage difference between a voltage in a pause state after charge and a voltage in a pause state after discharge is graphed.

The inventor of the present application has found that, in a range where the voltage difference is smaller than a minimum voltage difference in a range where a charge state is smaller than a charge state at the inflection point, a change amount in the voltage difference with respect to the charge state in a correlation between the voltage difference and the charge state is larger than a change amount in the voltage with respect to the charge state in a correlation between a charge state and a voltage in a pause state after discharge.

According to the management system described above, when the voltage difference is smaller than the minimum voltage difference in the range where the charge state is smaller than the charge state at the inflection point in the correlation represented by the voltage difference information, the charge state of the energy storage device is estimated by specifying the charge state corresponding to the voltage difference from the voltage difference information. Therefore, it is possible to more accurately estimate a charge state than a case of estimating a charge state from a correlation between a charge state and a voltage in a pause state after discharge.

The management unit may execute a second estimation process of measuring a current with the current measurement unit to estimate a charge state, and a correction process of correcting a charge state estimated in the second estimation process with a charge state estimated in the first estimation process.

Conventionally, a so-called current integration method of measuring a current with a current measurement unit to estimate a charge state is known. However, in the current integration method, measurement errors of the current measurement unit may accumulate and gradually cause inaccuracy. For this reason, a charge state estimated by the current integration method has been corrected with a charge state estimated from a correlation between a voltage and a charge state.

It is also possible to correct the charge state estimated by the current integration method with a charge state estimated from the post-discharge correlation information. However, as described above, in the range where the voltage difference is smaller than the minimum voltage difference in the range where the charge state is smaller than the charge state at the inflection point, it is possible to more accurately estimate a charge state when estimating based on the voltage difference information than a case of estimating based on the post-discharge correlation information.

According to the management system described above, since correction is performed with a charge state estimated from the voltage difference information in such a range, correction can be performed more accurately than a case where correction is performed based on a charge state estimated from the post-discharge correlation information.

The management system described above may include a storage unit that stores post-discharge correlation information indicating a correlation between a charge state and a voltage in a pause state after discharge, and the management unit may execute: an integration process of integrating an amount of discharge by measuring a current with the current measurement unit, with a start point when a charge state is estimated in the first estimation process; a third estimation process of estimating, when a voltage of the energy storage device decreases to a steep change region of a correlation represented by the post-discharge correlation information, a charge state of the energy storage device by specifying a charge state corresponding to the voltage from the post-discharge correlation information; and a capacity estimation process of estimating a charge capacity of the energy storage device based on a difference between a charge state estimated in the first estimation process and a charge state estimated in the third estimation process, and based on the amount of discharge between the first estimation process and the third estimation process.

Generally, a charge capacity of an electric energy storage device decreases with use. Since the charge capacity of the energy storage device is used for various managements of the energy storage device, it is required to accurately estimate the charge capacity in order to suppress deterioration of management accuracy. For example, in general, when a charge capacity of an energy storage device decreases to a certain level, use of the energy storage device is prohibited because the end of a service life has been reached. Therefore, it is required to accurately estimate the charge capacity of the energy storage device. In a case of estimating a charge state of the energy storage device with the current integration method, the charge capacity is to be a denominator for dividing an integrated current value. Therefore, it is required to accurately estimate the charge capacity of the energy storage device.

As a method of estimating a charge capacity of the energy storage device, a method is considered in which a charge state when the energy storage device is fully charged is set to be 100%, thereafter, a voltage of the energy storage device is measured and a charge state is estimated based on a correlation between the voltage and the charge state, and the charge capacity at the time of full charge is estimated based on a change in the charge state and an amount of discharge of the energy storage device between the first estimation process and the third estimation process. However, this method has a problem that the charge capacity cannot be estimated unless the energy storage device is fully charged.

According to the management system described above, since the charge capacity is estimated based on a difference between a charge state estimated in the first estimation process and a charge state estimated in the third estimation process, and based on an amount of discharge during that time, the charge capacity can be estimated even when the energy storage device is not fully charged.

However, since the post-discharge correlation information has a lower estimation accuracy of a charge state than the voltage difference information, estimation may not be accurate when using a charge state estimated from the post-discharge correlation information to estimate the charge capacity.

According to the management system described above, since the charge capacity is estimated by using a charge state estimated from the voltage difference information when the voltage difference is smaller than the minimum voltage difference in the range, the charge capacity can be estimated more accurately than a case of estimating the charge capacity by using a charge state estimated from the post-discharge correlation information.

According to the management system described above, in the third estimation process, a charge state corresponding to a voltage in the steep change region of the correlation represented by the post-discharge correlation information is estimated from the post-discharge correlation information. Since a change amount in a voltage with respect to a change in the charge state is larger in the steep change region than that in the minute change region, the charge state can be estimated more accurately than a case of estimating a charge state corresponding to a voltage in the minute change region.

Therefore, according to the management system described above, it is possible to accurately estimate the charge capacity even when the energy storage device is not fully charged.

A management method for an energy storage device using a positive active material that contains lithium iron phosphate and has a conductive layer formed on a surface includes, when a state in which a current value measured by a current measurement unit that measures a current flowing through the energy storage device is less than a reference value is defined as a pause state of the energy storage device, a discharge step of discharging the energy storage device when the energy storage device is brought into a pause state; a post-discharge measurement step of measuring a voltage with a voltage measurement unit that measures a voltage of the energy storage device after discharge of the energy storage device in the discharge step; and a first estimation step of estimating a charge state of the energy storage device based on a voltage measured in the post-discharge measurement step and based on a correlation between a charge state and a voltage in a pause state after discharge.

According to the above management method, it is possible to accurately estimate a charge state of the energy storage device using the positive active material that contains lithium iron phosphate and has the conductive layer formed on the surface.

The technique disclosed in the present specification can be realized in various aspects such as a control device, a control method, a computer program for realizing functions of the method or the device, and a recording medium on which the computer program is recorded.

<First Embodiment>

A first embodiment will be described with reference to FIGS. 1 to 6. In the following description, when referring to FIGS. 2 and 3, the description will be made in which a vertical direction of a battery case 21 in a state where the battery case 21 is placed horizontally without inclination with respect to an installation surface is defined as a Y direction, a direction along a long side direction of the battery case 21 is defined as an X direction, and a depth direction of the battery case 21 is defined as a Z direction.

(1-1) Structure of Battery

Figure 1:
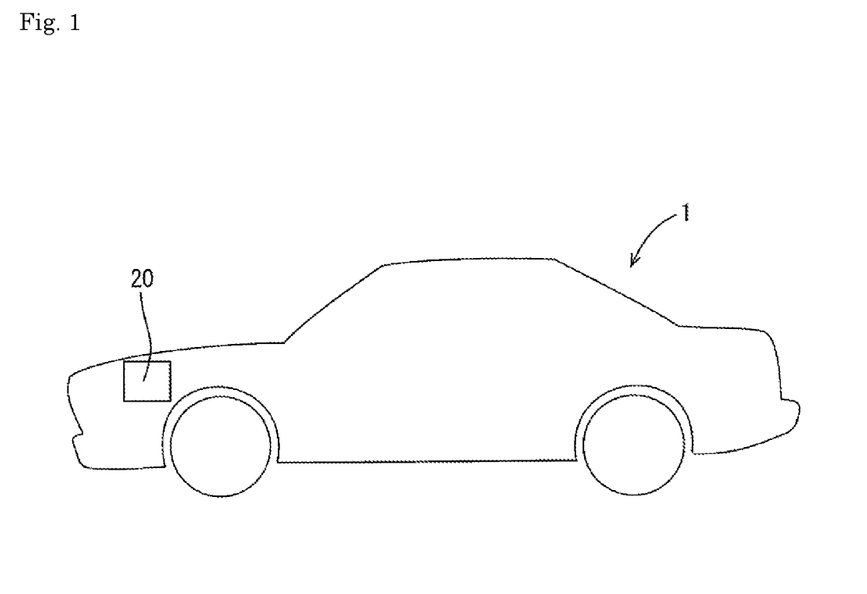
FIG. 1 is a schematic view showing a vehicle and a battery according to a first embodiment.

As shown in FIG. 1, a battery 20 is mounted on a vehicle 1 such as a gasoline (or diesel) engine vehicle or a hybrid vehicle. The battery 20 supplies (that is, discharges) electric power to an electric load such as a starter for start of the engine or headlights, and is charged by a generator (alternator) that uses the engine of the vehicle 1 as a power source.

Figure 2:
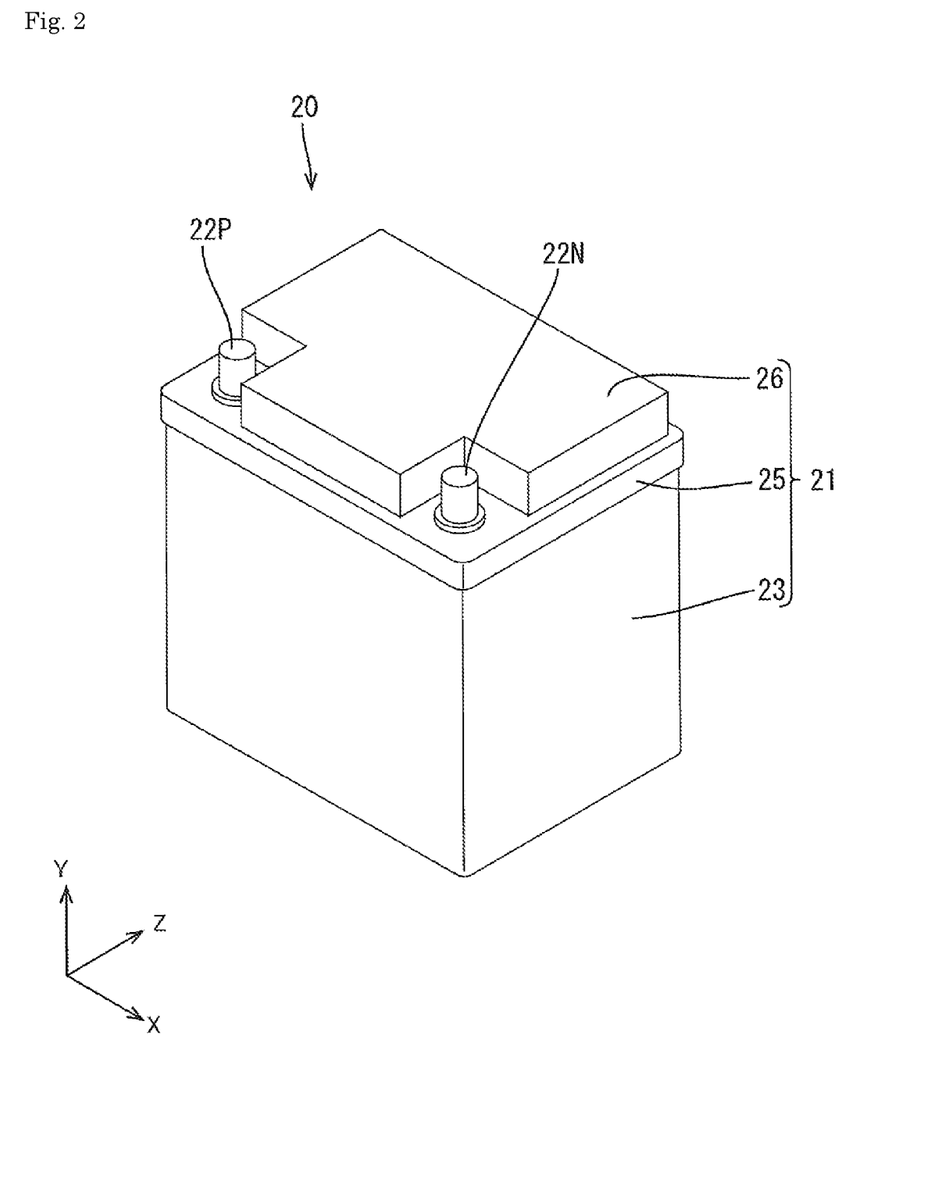
FIG. 2 is a perspective view of the battery.
Figure 3:
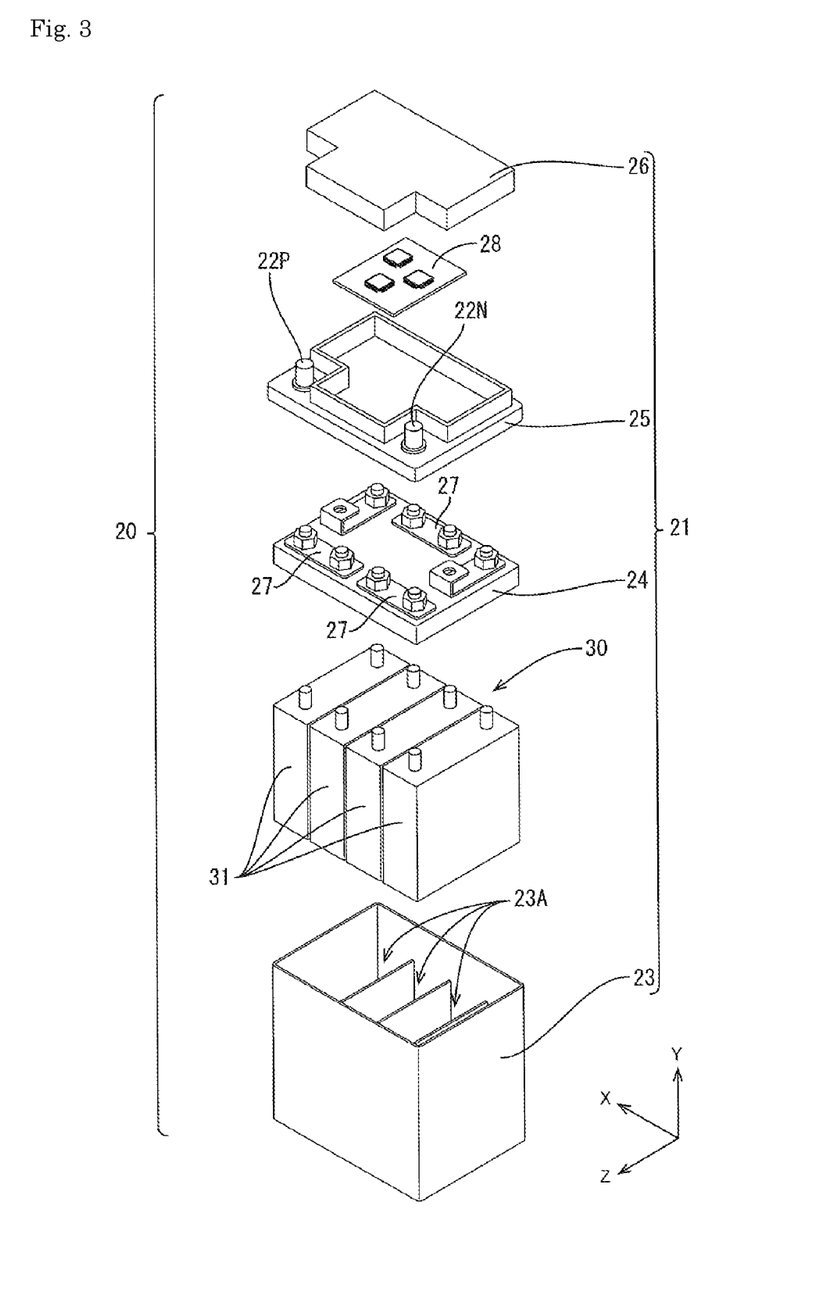
FIG. 3 is an exploded perspective view of the battery.

As shown in FIG. 2, the battery 20 has the block-shaped battery case 21. As shown in FIG. 3, the battery case 21 houses an assembled battery 30 (one example of an energy storage device) in which a plurality of battery cells 31 are in series connection, a control board 28, and the like. The battery case 21 may include: a box-shaped case body 23 that opens upward; a positioning member 24 that positions the plurality of battery cells 31; an inner lid 25 attached above the case body 23; and an upper lid 26 attached above the inner lid 25.

In the case body 23, a plurality of cell chambers 23A that individually house the respective battery cells 31 may be provided side by side in the X direction. The positioning member 24 may have a plurality of bus bars 27 arranged on an upper surface. By arranging the positioning member 24 above the plurality of battery cells 31 arranged in the case body 23, the plurality of battery cells 31 are positioned and connected in series by the plurality of bus bars 27.

The inner lid 25 has a substantially rectangular shape in plan view, and may have a height difference in the Y direction. At both ends of the inner lid 25 in the X direction, a positive electrode terminal 22P and a negative electrode terminal 22N connected with a harness terminal (not shown) are provided. The inner lid 25 internally houses the control board 28, and the assembled battery 30 and the control board 28 are connected by attaching the inner lid 25 to the case body 23.

(1-2) Electrical Configuration of Battery

Figure 4:
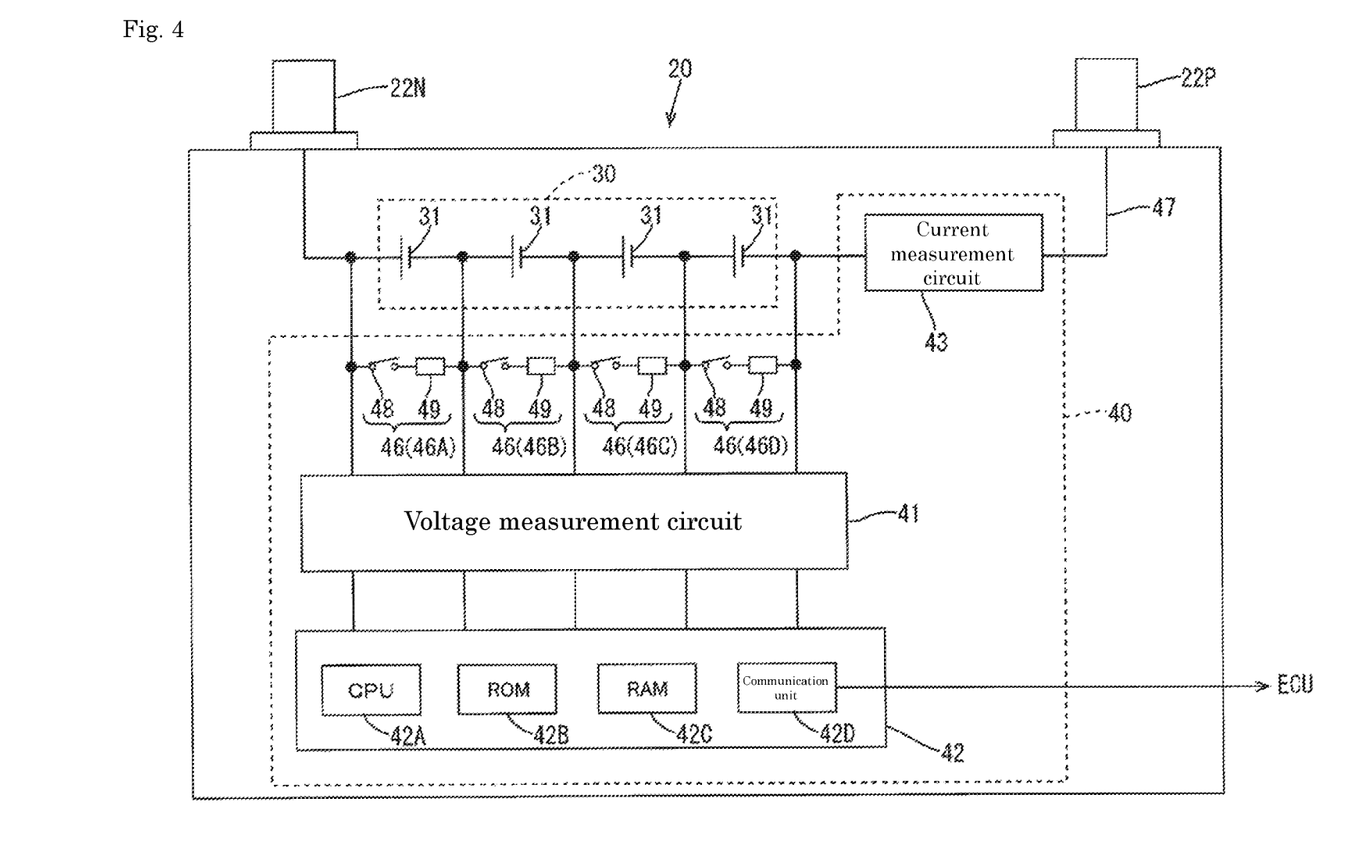
FIG. 4 is a circuit diagram of the battery.

An electrical configuration of the battery 20 will be described with reference to FIG. 4. The battery 20 includes the assembled battery 30 and a battery management system 40 (referred to as a BMS). The BMS 40 is one example of a management system for an energy storage device.

As described above, the assembled battery 30 is made by the plurality of battery cells 31 in series connection. Each battery cell 31 is a secondary battery that can be repeatedly charged. Specifically, each battery cell 31 is a lithium iron phosphate battery having a positive active material containing lithium iron phosphate in a mixing ratio of 51% or more, and a negative active material containing graphite in a mixing ratio of 51% or more, and having a conductive layer such as carbon formed on a surface of the positive active material. The assembled battery 30 is provided in a current path 47 connecting the positive electrode terminal 22P and the negative electrode terminal 22N, and is selectively connected to an electric load or an alternator mounted on the vehicle 1 via the positive electrode terminal 22P and the negative electrode terminal 22N.

The BMS 40 includes a management unit 42, a current sensor 43, a voltage sensor 45, and four equalizing circuits 46 (46A to 46D).

The management unit 42 operates with electric power supplied from the assembled battery 30, and includes a CPU 42A, a ROM 42B (one example of a storage unit), a RAM 42C, a communication unit 42D, and the like. The ROM 42B stores various control programs and data indicating post-discharge OCV-SOC characteristics 62, which will be described later (one example of post-discharge correlation information indicating a correlation between a charge state and a voltage in a pause state after discharge) and the like. The CPU 42A controls each part of the battery 20 by executing a control program stored in the ROM 42B.

The communication unit 42D is for communicating with an ECU mounted on the vehicle 1. Signals received by the management unit 42 from the ECU include: an ignition-on signal transmitted when an ignition switch of the vehicle 1 is at an ignition-on position; an engine start signal transmitted when the ignition switch is at an engine start position; an accessory signal transmitted when the ignition switch is at an accessory position; a lock signal transmitted when the ignition switch is at a lock position; and the like. It is also possible to transmit a signal from the management unit 42 to the ECU via the communication unit 42D.

The current sensor 43 is provided in the current path 47 in series with the assembled battery 30. The current sensor 43 measures a current value I [A] of a charge current flowing from the alternator to the assembled battery 30 during charge, and a current value I [A] of a discharge current flowing from the assembled battery 30 to the electric load during discharge, and outputs the measured current value I to the management unit 42. In the following description, when the charge current and the discharge current are not distinguished, they are referred to as charge-discharge current.

The voltage sensor 45 is connected to both ends of each battery cell 31 of the assembled battery 30. The voltage sensor 45 measures a voltage value V [V], which is a terminal voltage of the battery cell 31, and outputs the measured voltage value V to the management unit 42.

Each of the equalizing circuits 46A to 46D is in parallel connection with each of the battery cells 31. Each equalizing circuit 46 has a switch element 48 and a discharge resistor 49. When the switch element 48 is turned on, electric power of the battery cell 31 in parallel connection with the equalizing circuit 46 is discharged by the discharge resistor 49.

(1-3) Pause State of Assembled Battery

When the vehicle 1 is stopped and the ignition switch is switched to the lock position, the assembled battery 30 is brought into a pause state of not being charged by the alternator and not being discharged to the electric load mounted on the vehicle 1. However, a minute dark current may flow through the assembled battery 30 even in the pause state. For this reason, in the present embodiment, a state in which a current value measured by the current sensor 43 is less than a predetermined reference value is defined as a pause state of the assembled battery 30.

The cases where the assembled battery 30 is brought into the pause state include: a case of being brought into the pause state after charge (when a current equal to or higher than a reference value flows in a charge direction); and a case of being brought into the pause state after discharge (when a current equal to or higher than a reference value flows in a discharge direction).

For example, after the vehicle 1 is stopped, when the ignition switch is switched to the lock position while the assembled battery 30 is being charged by the alternator, the assembled battery 30 is brought into the pause state after charge. On the other hand, after the vehicle 1 is stopped, for example, when the ignition switch is switched to the accessory position with the headlights turned on, the assembled battery 30 is brought into a state of supplying (that is, discharging) electric power to the headlights. Thereafter, when the ignition switch is switched to the lock position, the assembled battery 30 is brought into the pause state after discharge Whether the assembled battery 30 has been brought into the pause state after charge or has been brought into the pause state after discharge may or may not be able to be determined. For example, in a case of using the current sensor 43 having a function of detecting a current flow direction, the determination can be made based on the current flow direction immediately before the pause state. On the other hand, in a case of using the current sensor 43 that does not have a function of detecting a current flow direction, the determination cannot be made since a current flow direction immediately before the pause state is not known. In the first embodiment, it is assumed that the current sensor 43 does not have a function of detecting a current flow direction.

The method of determining whether or not the assembled battery 30 has been brought into a pause state is not limited to the method of determining from a current value measured by the current sensor 43, but the determination can be made by an appropriate method. For example, when the management unit 42 receives a lock signal from the vehicle 1 via the communication unit 42D, the management unit 42 may determine that the assembled battery 30 has been brought into the pause state. That is, when the management unit 42 receives the lock signal from the vehicle 1, it is possible to determine that the assembled battery 30 has been brought into the pause state without determining whether or not a current value measured by the current sensor 43 is equal to or greater than a reference value.

(1-4) OCV-SOC Characteristics

A correlation between a voltage and an SOC of the assembled battery 30 will be described with reference to FIG. 5. In the present embodiment, the voltage refers to a voltage across the assembled battery 30 when a current flowing through the assembled battery 30 is equal to or less than a reference value. In the following description, this voltage is referred to as an open circuit voltage (OCV). The voltage is not limited to the voltage across the assembled battery 30 when the current is equal to or less than the reference value, but may be a voltage across the assembled battery 30 when a condition is satisfied that a voltage change amount per unit time of the assembled battery 30 when a current is equal to or less than the reference value is equal to or less than a predetermined specified amount.

Figure 5:
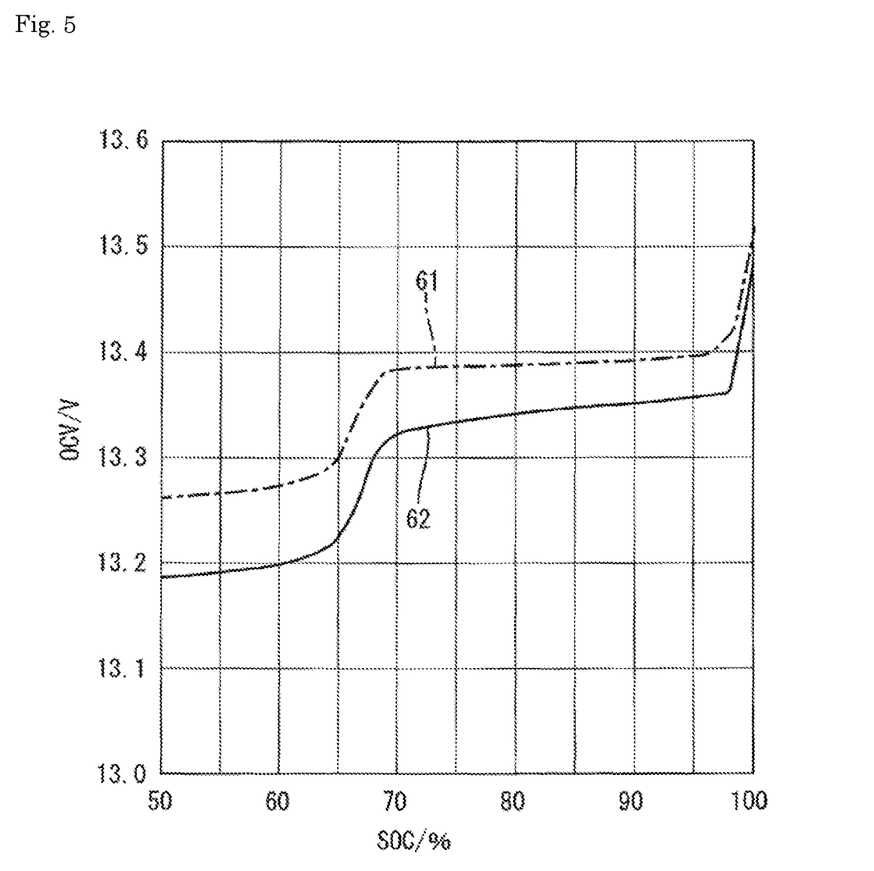
FIG. 5 is a graph showing a correlation between a charge state and a voltage in a pause state after charge, and a correlation between a charge state and a voltage in a pause state after discharge.

In FIG. 5, a dotted line 61 indicates a correlation between the OCV and the SOC when the assembled battery 30 is brought into a pause state after charge (hereinafter, referred to as "post-charge OCV-SOC characteristics 61"), while a solid line 62 indicates a correlation between the OCV and the SOC when the assembled battery 30 is brought into a pause state after discharge (hereinafter, referred to as "post-discharge OCV-SOC characteristics 62").

As shown in FIG. 5, in the assembled battery 30 having the positive active material that contains lithium iron phosphate and has the conductive layer such as carbon formed on the surface of the positive active material, there are characteristics (hereinafter referred to as "hysteresis characteristics") that OCV-SOC characteristics are different between a case where the energy storage device is brought into a pause state after charge and a case where the energy storage device is brought into a pause state after discharge. The hysteresis characteristics are caused by the positive active material.

As shown in FIG. 5, the assembled battery 30 having the negative active material containing graphite has a characteristic that there is a minute change region (plateau region) having a small OCV change amount per unit SOC (hereinafter referred to as "OCV change ratio") over a wide range. Specifically, in a case of the post-discharge OCV-SOC characteristics 62, a region where the SOC is about 64% or less and a region where the SOC is about 68% to about 98% are almost flat, and the OCV change ratio is equal to or less than the reference value. In the present embodiment, a region where the OCV change ratio is equal to or less than the reference value is referred to as a minute change region. The reference value can be optionally determined.

In the assembled battery 30 having the negative active material containing graphite, there is a steep change region (non-plateau region) in which the OCV change ratio is larger than a reference value, between the two minute change regions. In the example shown in FIG. 5, a region where the SOC is about 64% to about 68% corresponds to the steep change region. It is considered that the reason why the region where the SOC is about 64% to about 68% is to be the steep change region is that a stage structure of the negative active material containing graphite changes in this region.

Here, the description has been made with the region of about 64% to about 68% as an example of the steep change region of the energy storage device using graphite for a negative electrode, but the steep change region is variable depending on balance of a depth of charge of a positive electrode and a negative electrode, a progress of deterioration of the energy storage device, and the like, and is not necessarily in the range of about 64% to about 68%.

(1-5) Assembled Battery SOC Estimation Process

When the assembled battery 30 is brought into a pause state, the management unit 42 measures the OCV with the voltage sensor 45, and estimates the SOC of the assembled battery 30 by specifying the SOC corresponding to the measured OCV from the OCV-SOC characteristics.

As can be seen from FIG. 5, the post-charge OCV-SOC characteristics 61 have a smaller OCV change ratio as a whole than that of the post-discharge OCV-SOC characteristics 62. For this reason, when the SOC is estimated from the post-charge OCV-SOC characteristics 61, there is a concern that the estimation accuracy of the SOC is lower than a case where the SOC is estimated from the post-discharge OCV-SOC characteristics 62. When the assembled battery 30 is brought into a pause state, the management unit 42 discharges the assembled battery 30 with the equalizing circuit 46 irrespective of whether the assembled battery 30 has been charged or discharged immediately before the pause state, and then estimates the SOC from the post-discharge OCV-SOC characteristics 62.

Figure 6:
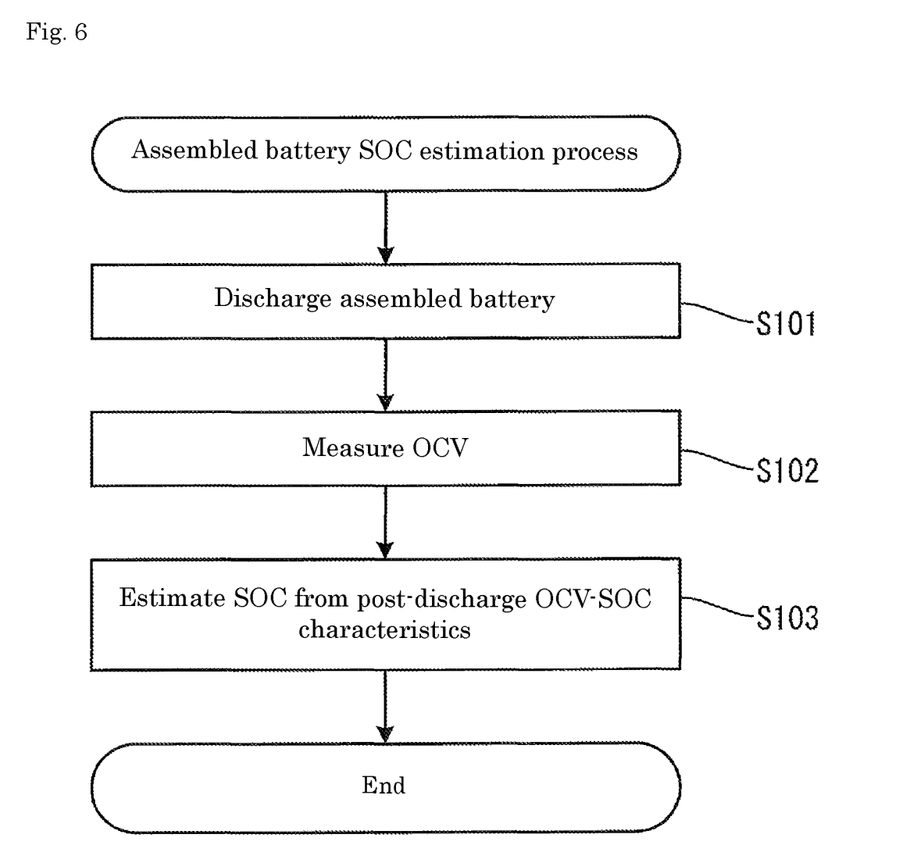
FIG. 6 is a flowchart of an assembled battery SOC estimation process.

With reference to FIG. 6, a description will be given to the SOC estimation process executed by the management unit 42. This process is started when the assembled battery 30 is brought into a pause state. In S101, the management unit 42 causes the equalizing circuit 46 to discharge the assembled battery 30 for a predetermined time (one example of a discharge process).

In S102, the management unit 42 measures the OCV with the voltage sensor 45 (a post-discharge measurement process). In S103, the management unit 42 estimates the SOC of the assembled battery 30 by specifying the SOC corresponding to the OCV measured in S102 from the post-discharge OCV-SOC characteristics 62 (one example of a first estimation process).

As described above, it may be possible to determine whether the assembled battery 30 has been brought into a pause state after charge or has been brought into a pause state after discharge. In that case, before S101, it may be determined whether the assembled battery 30 has been brought into a pause state after charge or has been brought into a pause state after discharge, and S101 may be skipped and S102 is executed when the assembled battery 30 has been brought into a pause state after discharge.

(1-6) Effects of Embodiment

According to the BMS 40 according to the first embodiment, in a case where the assembled battery 30 is brought into a pause state after charge, the assembled battery 30 is discharged by the equalizing circuit 46, and the SOC is estimated based on the post-discharge OCV-SOC characteristics 62. Therefore, the SOC of the assembled battery 30 can be estimated more accurately than a case where the estimation is made based on the post-charge OCV-SOC characteristics 61 or a case where the estimation is made based on an average of the OCV-SOC characteristics.

However, there are cases where it is not possible to know whether the assembled battery 30 has been charged or discharged immediately before the pause state. According to the BMS 40, when the assembled battery 30 is brought into a pause state, the assembled battery 30 is discharged regardless of whether the assembled battery 30 has been charged or discharged immediately before the pause state. Therefore, even when it is not possible to know whether the assembled battery 30 has been charged or discharged immediately before the pause state, the SOC can be accurately estimated.

Therefore, according to the BMS 40, the SOC of the assembled battery 30 using the positive active material that contains lithium iron phosphate and has the conductive layer formed on the surface can be accurately estimated.

According to the BMS 40, when the assembled battery 30 is brought into a pause state after charge, the SOC is estimated from the post-discharge OCV-SOC characteristics 62 after discharge of the assembled battery 30. Therefore, the SOC can be more accurately estimated than a case of estimating from the post-charge OCV-SOC characteristics 61.

<Second Embodiment>

A second embodiment of the present invention will be described with reference to FIGS. 5 to 8. In the second embodiment, when an assembled battery 30 is brought into a pause state after charge, an OCV is measured before and after discharge of the assembled battery 30, and an SOC of the assembled battery 30 is estimated from voltage difference-SOC characteristics 63 (see FIG. 7) indicating a correlation between the SOC and a voltage difference between the OCV in a pause state after charge and the OCV in a pause state after discharge.

A current sensor 43 according to the second embodiment has a function of detecting a current flow direction. For this reason, in the second embodiment, when the assembled battery 30 is brought into a pause state, a management unit 42 can determine, from a flow direction detected by the current sensor 43, whether being brought into the pause state after charge or being brought into the pause state after discharge.

(2-1) Voltage Difference-SOC Characteristics

Voltage difference-SOC characteristics will be described with reference to FIG. 7. Voltage difference-SOC characteristics 63 are obtained by subtracting a voltage of post-discharge OCV-SOC characteristics 62 from a voltage of post-charge OCV-SOC characteristics 61. As described above, in the assembled battery 30, a positive active material contains lithium iron phosphate, a negative active material contains graphite, and a conductive layer such as carbon is formed on a surface of the positive active material. In such an assembled battery 30, as shown in FIG. 7, an inflection point 64 (that is also a maximum point in FIG. 7) appears when a correlation between the SOC and a voltage difference between a voltage in a pause state after charge and a voltage in a pause state after discharge is graphed.

As can be seen by comparing FIGS. 5 and 7, in a range L1 where the SOC is larger than the SOC (around 66%) of the inflection point 64 (a range to the right of the inflection point 64 in FIG. 7), a change amount in a voltage difference per unit SOC (hereinafter referred to as a "voltage difference change ratio") is larger than the OCV change ratio of the post-discharge OCV-SOC characteristics 62. For this reason, in the range L1, the SOC can be more accurately estimated by specifying the SOC from the voltage difference-SOC characteristics 63 than a case of estimating the SOC from the post-discharge OCV-SOC characteristics 62.

On the other hand, in a range L2 where the SOC is smaller than the SOC of the inflection point 64 (a range to the left of the inflection point 64 in FIG. 7), the OCV change ratio of the post-discharge OCV-SOC characteristics 62 is larger than the voltage difference change ratio. For this reason, in the range L2, the SOC can be more accurately estimated by specifying the SOC from the post-discharge OCV-SOC characteristics 62 than a case of estimating the SOC from the voltage difference-SOC characteristics 63.

Figure 7:
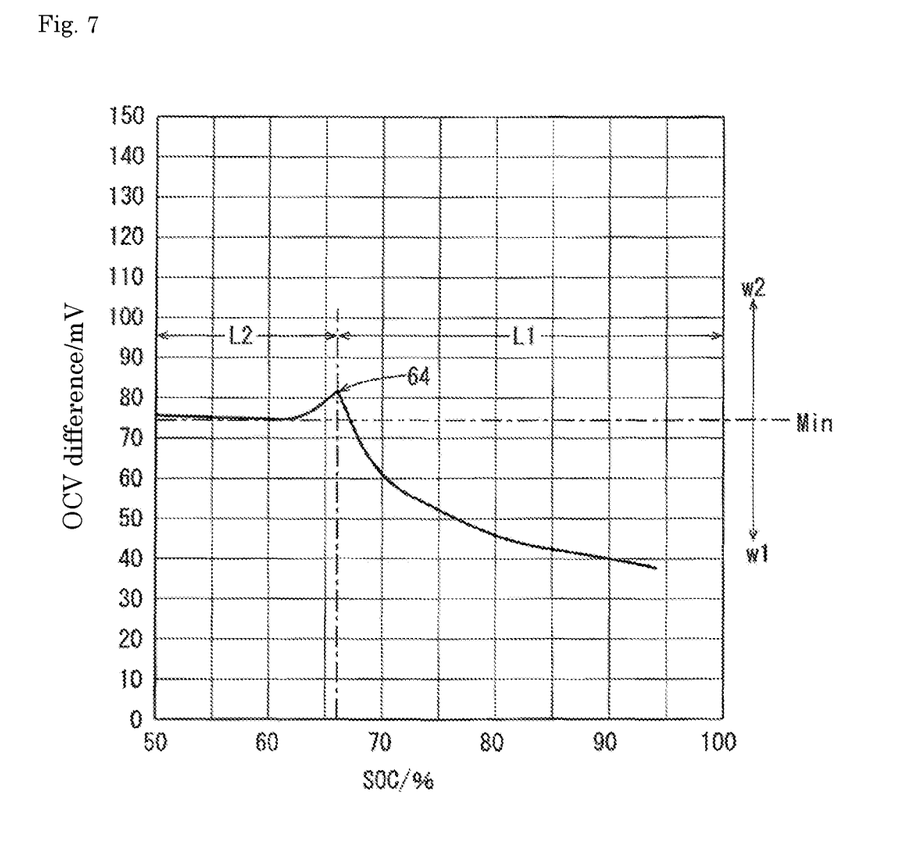
FIG. 7 is a graph showing a correlation between a charge state and a voltage difference between a voltage in a pause state after charge and a voltage in a pause state after discharge according to a second embodiment.

However, as shown in FIG. 7, when the voltage difference is equal to or larger than a minimum voltage difference Min in the range L2, the SOC cannot be estimated from only the voltage difference since two SOCs correspond to one voltage difference. On the other hand, in a range W1 where the voltage difference is smaller than the minimum voltage difference Min, the voltage difference and the SOC correspond one-to-one. Therefore, the management unit 42 estimates the SOC from the voltage difference-SOC characteristics 63 in the range W1 where the voltage difference is smaller than the minimum voltage difference Min, and estimates the SOC from the post-discharge OCV-SOC characteristics 62 in a range W2 where the voltage difference is equal to or larger than the minimum voltage difference Min.

A ROM 42B according to the second embodiment stores data indicating the post-discharge OCV-SOC characteristics 62 (one example of post-discharge correlation information indicating a correlation between a charge state and a voltage in a pause state after discharge). Further, the ROM 42B according to the second embodiment also stores data indicating the voltage difference-SOC characteristics 63 (one example of voltage difference information indicating a correlation between a charge state and a voltage difference between a voltage in a pause state after charge and a voltage in a pause state after discharge).

(2-2) Correction of SOC Estimated by Current Integration Method

A current integration method is a method of constantly measuring a charge-discharge current of the assembled battery 30 with the current sensor 43 to measure an amount of electric power entering and exiting the assembled battery 30, and estimating the SOC by adjusting this from an initial capacity. The current integration method has an advantage that the SOC can be estimated even when the assembled battery 30 is being used. For this reason, the management unit 42 estimates the SOC of the assembled battery 30 with the current integration method.

Since the current integration method constantly measures a current and integrates the charge-discharge watt-hour, measurement errors of the current sensor 43 may accumulate and gradually cause inaccuracy. Therefore, when the assembled battery 30 is brought into a pause state, the management unit 42 corrects the SOC estimated by the current integration method, with the SOC estimated from the voltage difference-SOC characteristics 63 or the post-discharge OCV-SOC characteristics 62.

Specifically, the management unit 42 performs the correction with the SOC estimated from the voltage difference-SOC characteristics 63 when the voltage difference is smaller than the minimum voltage difference Min in the range L2, and performs the correction with the SOC estimated from the post-discharge OCV-SOC characteristics 62 when the voltage difference is equal to or larger than the minimum voltage difference Min.

Correcting the SOC estimated by the current integration method with the SOC estimated from the voltage difference-SOC characteristics 63 or the post-discharge OCV-SOC characteristics 62 causes the accumulation of errors in the current integration method to be cut off, which can improve the estimation accuracy of the SOC estimated by the current integration method.

(2-3) Estimation of Charge Capacity

Generally, a charge capacity of a lithium ion battery decreases with use. For this reason, the management unit 42 estimates a charge capacity of the assembled battery 30.

As a method of estimating the charge capacity of the assembled battery 30, a method is considered in which the SOC when the assembled battery 30 is fully charged is set to 100%, thereafter, the OCV of the assembled battery 30 is measured and the SOC is estimated from OCV-SOC characteristics, and the charge capacity at the time of full charge is estimated from a change in the SOC and an amount of discharge of the assembled battery 30 during that time.

However, in this method, the charge capacity cannot be estimated unless the assembled battery 30 is fully charged. Therefore, the management unit 42 estimates the SOC at two mutually different time points, and estimates the charge capacity of the assembled battery 30 from a difference between the SOCs and an amount of discharge during that time.

Specifically, as described above, when the assembled battery 30 is brought into a pause state after charge, the management unit 42 discharges the assembled battery 30 to estimate an SOC (here, referred to as "SOC 1"). When a voltage difference is smaller than the minimum voltage difference Min, the SOC is estimated from the voltage difference-SOC characteristics 63, and when the voltage difference is equal to or larger than the minimum voltage difference Min, the SOC is estimated from the post-discharge OCV-SOC characteristics 62.

The management unit 42 measures an amount of discharge by measuring a current value at regular time intervals with the current sensor 43, with a time point when the OCV is measured after discharge as a start point, and integrating the measured current values (one example of the integration process), and measures the OCV at regular time intervals with the voltage sensor 45.

When the voltage sensor 45 measures the OCV in the steep change region of the post-discharge OCV-SOC characteristics 62, the management unit 42 estimates an SOC (here, referred to as "SOC 2") by specifying the SOC corresponding to the measured OCV from the post-discharge OCV-SOC characteristics 62 (one example of a third estimation process). The management unit 42 estimates the charge capacity from the following Equation 1 (one example of a capacity estimation process).

Charge capacity={amount of discharge/($SOC1-SOC2$)}×100 Formula correction

The reason of using the SOC corresponding to the OCV in the steep change region as the SOC 2 is because the SOC can be specified more accurately than a case of specifying the SOC corresponding to the OCV in the minute change region since the OCV change ratio is larger in the steep change region than that in the minute change region.

(2-4) Assembled Battery SOC Estimation Process

Figure 8:
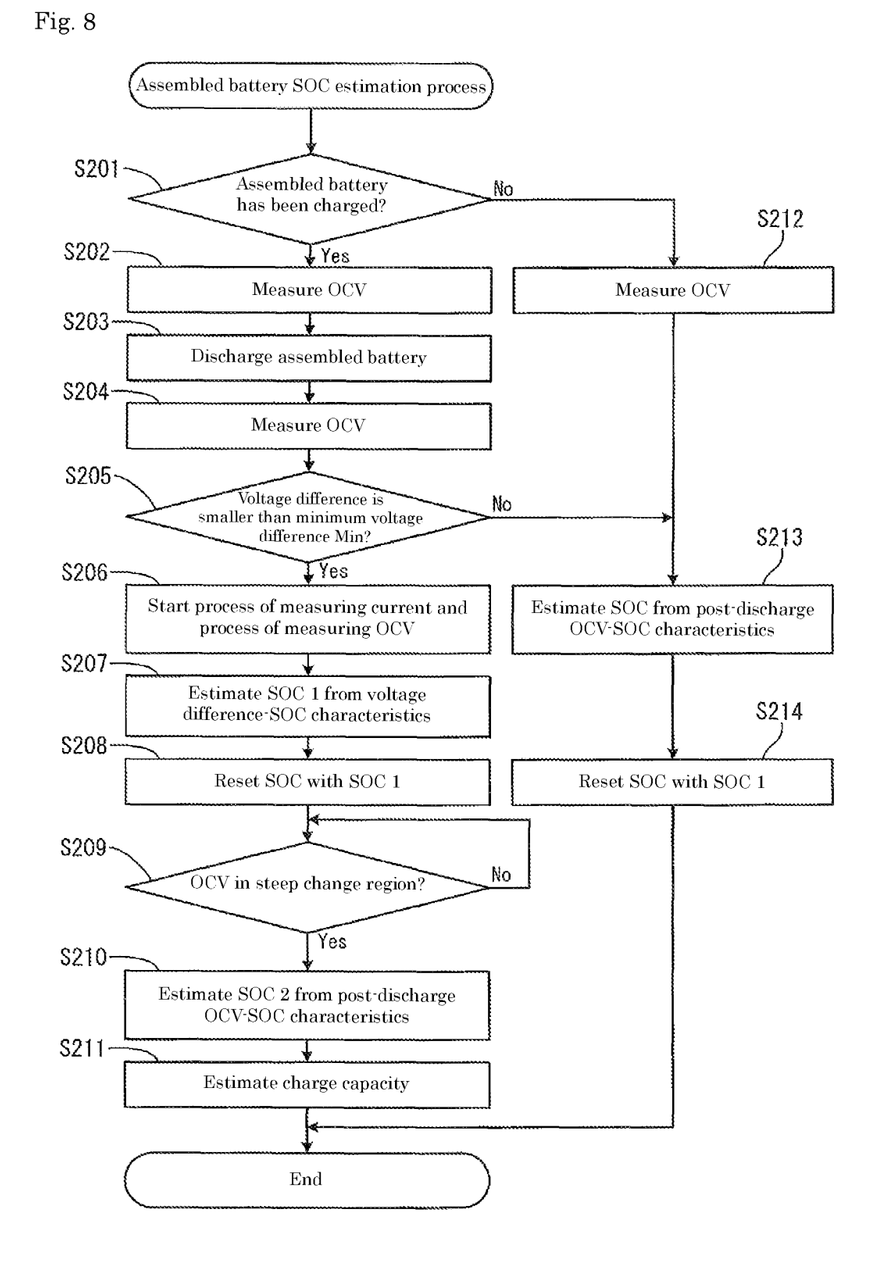
FIG. 8 is a flowchart of an assembled battery SOC estimation process.

With reference to FIG. 8, an SOC estimation process executed by the management unit 42 according to the second embodiment will be described. This process is started when the assembled battery 30 is brought into a pause state. In FIG. 8, a process of estimating the charge capacity by using the SOC estimated from the post-discharge OCV-SOC characteristics 62 is omitted.

In S201, the management unit 42 determines, from a flow direction detected by the current sensor 43, whether the assembled battery 30 has been charged or discharged immediately before the pause state. The process proceeds to S202 when the assembled battery 30 has been charged, and the process proceeds to S212 when the assembled battery 30 has not been charged (that is, has been discharged).

In S202, the management unit 42 measures the OCV of the assembled battery 30 with the voltage sensor 45 (a pre-discharge measurement process).

In S203, the management unit 42 causes the equalizing circuit 46 to discharge the assembled battery 30 for a predetermined time.

In S204, the management unit 42 measures a voltage of the assembled battery 30 with the voltage sensor 45 (a post-discharge measurement process).

In S205, the management unit 42 determines whether or not a difference (voltage difference) between the OCV measured before discharge and the OCV measured after discharge is smaller than the minimum voltage difference Min in the range L2. The process proceeds to S206 when the difference is smaller, and the process proceeds to S213 when the difference is equal to or larger than the minimum voltage difference Min. In S206, the management unit 42 starts a process of measuring a current value at regular time intervals with the current sensor 43 and integrating the current values, and a process of measuring the OCV with the voltage sensor 45 at regular time intervals.

In S207, the management unit 42 estimates the SOC (that is, the SOC 1) of the assembled battery 30 by specifying the SOC corresponding to the voltage difference from the voltage difference-SOC characteristics 63 (one example of a first estimation process). In S208, the management unit 42 corrects the SOC estimated by the current integration method, with the SOC 1. In S209, the management unit 42 determines whether or not the OCV measured with the voltage sensor 45 is the OCV in the steep change region, and the process proceeds to S210 in a case of the OCV in the steep change region.

In S210, the management unit 42 estimates the SOC (that is, the SOC 2) by specifying the SOC corresponding to the OCV in the steep change region from the post-discharge OCV-SOC characteristics 62 (the third estimation process). In S211, the management unit 42 estimates a charge capacity from the above-described Equation 1.

In S212, the management unit 42 measures the OCV of the assembled battery 30 with the voltage sensor 45. In S213, the management unit 42 estimates the SOC (that is, the SOC 1) by specifying the SOC corresponding to the OCV measured in S204 or S212 from the post-discharge OCV-SOC characteristics 62. In S214, the management unit 42 corrects the SOC estimated by the current integration method, with the SOC 1.

(2-5) Effects of Embodiment

According to the BMS 40 according to the second embodiment, when a voltage difference is smaller than the minimum voltage difference Min in the range L2 where the SOC is smaller than the SOC at the inflection point 64 of the voltage difference-SOC characteristics 63, the SOC of the assembled battery 30 is estimated by specifying the SOC corresponding to the voltage difference from the voltage difference-SOC characteristics 63. Therefore, the SOC can be more accurately estimated than a case of estimating the SOC from the post-discharge OCV-SOC characteristics 62.

According to the BMS 40, when the assembled battery 30 is brought into a pause state, the SOC estimated by the current integration method is corrected with the SOC estimated from the voltage difference-SOC characteristics 63 when a voltage difference is smaller than the minimum voltage difference Min in the range L2. Therefore, the SOC can be more accurately corrected than a case of correcting with the SOC estimated from the post-discharge OCV-SOC characteristics 62.

According to the BMS 40, since the charge capacity is estimated based on a difference between the SOC 1 estimated in the first estimation process (S207) and the SOC 2 estimated in the third estimation process (S210) and based on an amount of discharge during that time, the charge capacity can be estimated even when the assembled battery 30 is not fully charged.

According to the BMS 40, since the SOC is estimated by using the SOC estimated from the voltage difference-SOC characteristics 63 when the voltage difference is smaller than the minimum voltage difference Min in the range L2, the charge capacity can be more accurately estimated than a case of using the SOC estimated from the post-discharge OCV-SOC characteristics 62.

According to the BMS 40, in the third estimation process, the SOC corresponding to the OCV in the steep change region of the post-discharge OCV-SOC characteristics 62 is estimated from the post-discharge OCV-SOC characteristics 62. Since the OCV change ratio is larger in the steep change region than that in the minute change region, the SOC can be specified more accurately than a case of specifying the SOC corresponding to the OCV in the minute change region. Therefore, according to the BMS 40, it is possible to accurately estimate the charge capacity even when the energy storage device is not fully charged.

<Other Embodiments>

The technique disclosed in the present specification is not limited to the embodiments described above and illustrated in the drawings, but includes, for example, the following various aspects.

(1) In the above embodiment, a case where the assembled battery 30 is discharged by the equalizing circuit 46 has been described as an example. Meanwhile, the management unit 42 may discharge the assembled battery 30 by requesting an ECU of the vehicle 1 to consume electric power of the assembled battery 30, via the communication unit 42D.

(2) In the above embodiment, as a management unit, the management unit 42 having one CPU 42A has been described as an example, but the configuration of the management unit is not limited to this. For example, the management unit may have a configuration including a plurality of CPUs, a configuration including a hardware circuit such as an application specific integrated circuit (ASIC) or a field-programmable gate array (FPGA), or a configuration including both the hardware circuit and the CPU.

1: SOC
20: battery
30: assembled battery (one example of energy storage device)
40: BMS (one example of management system)
42: management unit
42B: ROM (one example of storage unit)
43: current sensor (one example of current measurement unit)
45: voltage sensor (one example of voltage measurement unit)
61: post-charge OCV-SOC characteristics (one example of correlation between charge state and voltage in pause state after charge)
62: post-discharge OCV-SOC characteristics (one example of correlation between charge state and voltage in pause state after discharge)
63: voltage difference-SOC characteristics (one example of correlation between charge state and voltage difference between voltage in pause state after charge and voltage in pause state after discharge)
64: inflection point

The invention claimed is:

1. A management system for an energy storage device using a positive active material that contains lithium iron phosphate, a conductive layer being formed on a surface of the positive active material, the management system comprising:
 a current measurement unit that measures a current flowing through the energy storage device;
 a voltage measurement unit that measures a voltage of the energy storage device; and
 a management unit,
 wherein:
  when a state in which a current value measured by the current measurement unit is less than a reference value is defined as a pause state of the energy storage device, the management unit executes:
   a discharge process of discharging the energy storage device when the energy storage device is brought into the pause state,
   a post-discharge measurement process of measuring a voltage with the voltage measurement unit after discharge of the energy storage device in the discharge process, and
   a first estimation process of estimating a charge state of the energy storage device based on the voltage measured in the post-discharge measurement process and based on a correlation between a charge state and a voltage in the pause state after discharge.

2. The management system for an energy storage device according to claim 1, further comprising:
a storage unit that stores post-discharge correlation information indicating the correlation between a charge state and a voltage in the pause state after discharge,
wherein the management unit estimates, in the first estimation process, a charge state of the energy storage device by defining a charge state corresponding to the voltage measured in the post-discharge measurement process from the post-discharge correlation information.

3. The management system for an energy storage device according to claim 1, wherein:
a negative active material of the energy storage device contains graphite,
the management system includes a storage unit that stores voltage difference information indicating a correlation between a charge state and a voltage difference between a voltage in the pause state after charge and a voltage in the pause state after discharge, and
the management unit:
executes a pre-discharge measurement process of measuring a voltage with the voltage measurement unit before discharge of the energy storage device in the discharge process when the energy storage device is brought into the pause state after charge, and
estimates a charge state of the energy storage device by defining a charge state corresponding to a voltage difference from the voltage difference information when, in the first estimation process, the voltage difference between the voltage measured in the pre-discharge measurement process and the voltage measured in the post-discharge measurement process is smaller than a minimum voltage difference in a range where a charge state is smaller than a charge state at an inflection point of the voltage difference.

4. The management system for an energy storage device according to claim 3, wherein the management unit executes:
a second estimation process of measuring a current with the current measurement unit to estimate a charge state, and
a correction process of correcting a charge state estimated in the second estimation process with a charge state estimated in the first estimation process.

5. The management system for an energy storage device according to claim 3, further comprising:
a storage unit that stores post-discharge correlation information indicating the correlation between a charge state and a voltage in the pause state after discharge,
wherein the management unit executes:
an integration process of integrating an amount of discharge by measuring a current with the current measurement unit, with a start point when a charge state is estimated in the first estimation process;
a third estimation process of estimating, when a voltage of the energy storage device decreases to a steep change region of the correlation represented by the post-discharge correlation information, a charge state of the energy storage device by defining a charge state corresponding to the voltage from the post-discharge correlation information; and
a capacity estimation process of estimating a charge capacity of the energy storage device based on a difference between a charge state estimated in the first estimation process and a charge state estimated in the third estimation process, and based on the amount of discharge between the first estimation process and the third estimation process.

6. The management system for an energy storage device according to claim 4, further comprising:
a storage unit that stores post-discharge correlation information indicating the correlation between a charge state and a voltage in the pause state after discharge,
wherein the management unit executes:
an integration process of integrating an amount of discharge by measuring a current with the current measurement unit, with a start point when a charge state is estimated in the first estimation process;
a third estimation process of estimating, when a voltage of the energy storage device decreases to a steep change region of the correlation represented by the post-discharge correlation information, a charge state of the energy storage device by defining a charge state corresponding to the voltage from the post-discharge correlation information; and
a capacity estimation process of estimating a charge capacity of the energy storage device based on a difference between a charge state estimated in the first estimation process and a charge state estimated in the third estimation process, and based on the amount of discharge between the first estimation process and the third estimation process.

7. The management system for an energy storage device according to claim 1, wherein the reference value is greater than zero.

8. A battery including an energy storage device using a positive active material that contains lithium iron phosphate, a conductive layer being formed on a surface of the positive active material, the battery comprising:
a current measurement unit that measures a current flowing through the energy storage device;
a voltage measurement unit that measures a voltage of the energy storage device; and
a management unit,
wherein, when a state in which a current value measured by the current measurement unit is less than a reference value is defined as a pause state of the energy storage device, the management unit executes:
a discharge process of discharging the energy storage device when the energy storage device is brought into the pause state,
a post-discharge measurement process of measuring a voltage with the voltage measurement unit after discharge of the energy storage device in the discharge process, and
a first estimation process of estimating a charge state of the energy storage device based on the voltage measured in the post-discharge measurement process and based on a correlation between a charge state and a voltage in a pause state after discharge.

9. A management method for an energy storage device using a positive active material that contains lithium iron phosphate, a conductive layer being formed on a surface of the positive active material, the management method comprising:
when a state in which a current value measured by a current measurement unit that measures a current flowing through the energy storage device is less than a reference value is defined as a pause state of the energy storage device, a discharge step of discharging the energy storage device when the energy storage device is brought into a pause state;

a post-discharge measurement step of measuring a voltage of the energy storage device with a voltage measurement unit after discharge of the energy storage device in the discharge step; and a first estimation step of estimating a charge state of the energy storage device based on the voltage measured in the post-discharge measurement step and based on a correlation between a charge state and a voltage in the pause state after discharge.

* * * * *